US012568572B2

(12) United States Patent
Lin et al.

(10) Patent No.: US 12,568,572 B2
(45) Date of Patent: Mar. 3, 2026

(54) ULTRAVIOLET GLUE-CONTROLLED IMPEDANCE

(71) Applicant: DELL PRODUCTS L.P., Round Rock, TX (US)

(72) Inventors: Pei-Ju Lin, Taoyuan Dist. (TW); Chang-Hsien Chen, New Taipei (TW); Bhyrav Mutnury, Austin, TX (US); Yi-Tang Chen, Xinzhuang (TW)

(73) Assignee: Dell Products L.P., Round Rock, TX (US)

( * ) Notice: Subject to any disclaimer, the term of this patent is extended or adjusted under 35 U.S.C. 154(b) by 331 days.

(21) Appl. No.: 18/362,230

(22) Filed: Jul. 31, 2023

(65) Prior Publication Data

US 2025/0048539 A1     Feb. 6, 2025

(51) Int. Cl.
| | |
|---|---|
| *H05K 1/02* | (2006.01) |
| *H01P 3/02* | (2006.01) |
| *H01P 3/08* | (2006.01) |
| *H01P 11/00* | (2006.01) |
| *H05K 1/18* | (2006.01) |
| *H05K 3/28* | (2006.01) |

(52) U.S. Cl.
CPC ............. *H05K 1/025* (2013.01); *H01P 3/081* (2013.01); *H05K 1/18* (2013.01)

(58) Field of Classification Search
CPC ...... H05K 1/025; H05K 1/024; H05K 1/0245; H05K 3/28; H05K 3/0091; H01P 3/081; H01P 3/08; H01P 3/026; H01P 11/003
See application file for complete search history.

(56) References Cited

U.S. PATENT DOCUMENTS

| | | | |
|---|---|---|---|
| 9,936,572 B2 | 4/2018 | Chandra et al. | |
| 2005/0130501 A1 | 6/2005 | Timmins et al. | |
| 2005/0190587 A1* | 9/2005 | Greeff ..................... | H01P 3/081 |
| | | | 365/51 |
| 2017/0303395 A1* | 10/2017 | Ishida ..................... | H05K 3/22 |
| 2021/0378094 A1 | 12/2021 | Chandra et al. | |

* cited by examiner

*Primary Examiner* — Timothy J Thompson
*Assistant Examiner* — Amol H Patel
(74) *Attorney, Agent, or Firm* — Larson Newman, LLP

(57)     ABSTRACT

A printed circuit board comprising a differential microstrip pair including a neck-down area and an ultraviolet glue coating a portion of the neck-down area of the differential microstrip pair to control an impedance of the differential microstrip pair.

20 Claims, 5 Drawing Sheets

| Row | Trace Width | Spacing | Impedance | Ultraviolet Glue Thickness |
|---|---|---|---|---|
| 1 | 5.5 mils | 6 mils | 85 Ohms | Not Applicable |
| 2 | 3.5 mils | 4 mils | 93 Ohms | Not Applicable |
| 3 | 3.5 mils | 4 mils | 85 Ohms | 3 mils |
| 4 | 3.5 mils | 4 mils | 86 Ohms | 2 mils |
| 5 | 3.5 mils | 4 mils | 86.5 Ohms | 1.5 mils |
| 6 | 3.5 mils | 4 mils | 87 Ohms | 1 mil |

Information Handling System

502 Processor

504 Processor

534 Video Display

520 Memory 510 506

508

530 536 Graphics Interface

522 Chipset 532

540 NVRAM
542 BIOS/EFI

592

570 I/O Interface

512

550 Disk Controller

576 TPM

580 Network Interface

574 Add-On Resource

572

556 ODD

552

554 HDD

590 BMC

594

582

560 Disk Emulator 564 562

Solid State Drive

ULTRAVIOLET GLUE-CONTROLLED IMPEDANCE

FIELD OF THE DISCLOSURE

The present disclosure generally relates to information handling systems, and more particularly relates to ultraviolet glue-controlled impedance.

BACKGROUND

As the value and use of information continues to increase, individuals and businesses seek additional ways to process and store information. One option is an information handling system. An information handling system generally processes, compiles, stores, or communicates information or data for business, personal, or other purposes. Technology and information handling needs and requirements can vary between different applications. Thus, information handling systems can also vary regarding what information is handled, how the information is handled, how much information is processed, stored, or communicated, and how quickly and efficiently the information can be processed, stored, or communicated. The variations in information handling systems allow information handling systems to be general or configured for a specific user or specific use such as financial transaction processing, airline reservations, enterprise data storage, or global communications. In addition, information handling systems can include a variety of hardware and software resources that can be configured to process, store, and communicate information and can include one or more computer systems, graphics interface systems, data storage systems, networking systems, and mobile communication systems. Information handling systems can also implement various virtualized architectures. Data and voice communications among information handling systems may be via networks that are wired, wireless, or some combination.

SUMMARY

A printed circuit board comprising a differential microstrip pair including a neck-down area and an ultraviolet glue coating a portion of the neck-down area of the differential microstrip pair to control an impedance of the differential microstrip pair

BRIEF DESCRIPTION OF THE DRAWINGS

It will be appreciated that for simplicity and clarity of illustration, elements illustrated in the Figures are not necessarily drawn to scale. For example, the dimensions of some elements may be exaggerated relative to other elements. Embodiments incorporating teachings of the present disclosure are shown and described with respect to the drawings herein, in which:

FIG. 4 is a table showing results of a sensitivity analysis to a neck-down area of a differential microstrip pair, according to an embodiment of the present disclosure.

The use of the same reference symbols in different drawings indicates similar or identical items.

DETAILED DESCRIPTION OF THE DRAWINGS

The following description in combination with the Figures is provided to assist in understanding the teachings disclosed herein. The description is focused on specific implementations and embodiments of the teachings and is provided to assist in describing the teachings. This focus should not be interpreted as a limitation on the scope or applicability of the teachings.

Figure 1:
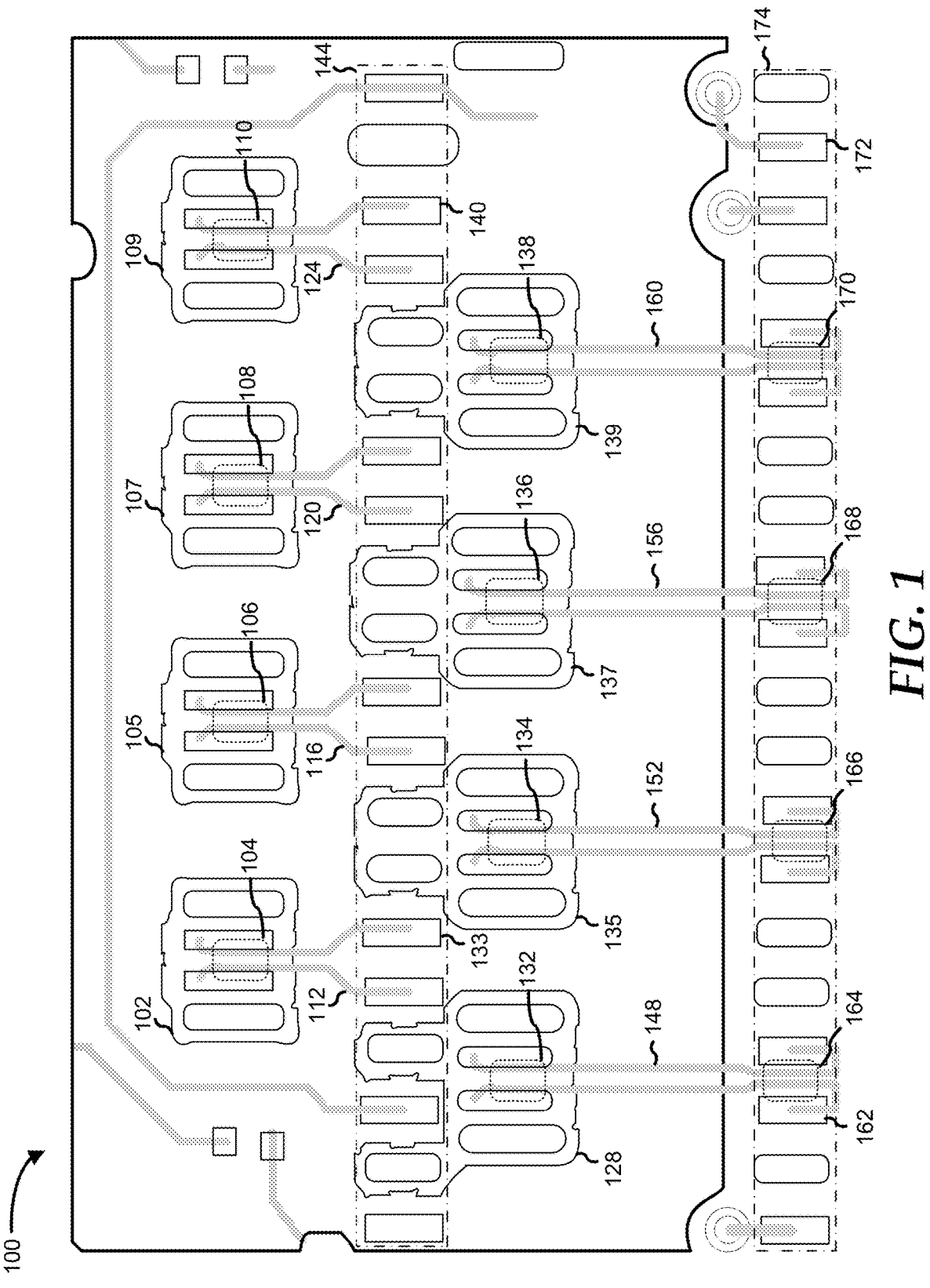
FIG. 1 is a diagram of a printed circuit board, according to an embodiment of the present disclosure.
Figure 5:
FIG. 5 is a block diagram illustrating an information handling system, according to an embodiment of the present disclosure.

FIG. 1 shows a printed circuit board (PCB) 100 of an information handling system, similar to information handling system 500 of FIG. 5. For purposes of this disclosure, an information handling system can include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, the information handling system can be a personal computer, a laptop computer, a smartphone, a tablet device or other consumer electronic device, a network server, a network storage device, a switch, a router, or another network communication device, or any other suitable device and may vary in size, shape, performance, functionality, and price. Further, the information handling system can include processing resources for executing machine-executable code, such as a processor, a programmable logic array (PLA), an embedded device such as a System-on-a-Chip (SoC), or other control logic hardware. The information handling system can also include one or more computer-readable media for storing machine-executable code, such as software or data.

Information handling systems include PCBs that interconnect hardware components within the systems. These PCBs include traces, which are conductive pathways between endpoints, that interconnect the hardware components, such that they may communicate with each other to coordinate the execution of user tasks. With the increasing demand for higher data rates for information handling systems, the current design trend is towards high-speed signaling using multiple parallel transmission lines in the traces of the PCB. As the number of hardware components and the amount of information being exchanged between these components increases, the number of traces also increases. As the size of the PCBs remains the same, the density of traces increases with the increased number of traces. In addition, the form factors of information handling systems are also decreasing, which further increases the density of the traces and the PCBs. Accordingly, the routing density of the traces also increases.

The usage of cables becoming common for internal routing. The cables may also be soldered directly into the PCB using a hot-bar bonding approach. For example, cable surface mounting pads may be used. However, small imperfections with cable mounting can impact high-speed data transmission. When connectors and cables are used on either side of the printed circuit board, routing of traces becomes very tight. Accordingly, because of the location of the cables and the one or more connectors coupled to the PCB, the traces may be necked down so that they can be routed. This typically results in higher impedance that impacts the signal margins. Reducing the impedance may also reduce the impact of the neck-down areas to the margin. Thus, it is desirable to control the impedance in areas where traces are necked down.

A riser card, such as depicted herein, may include one or more connectors into which expansion cards can be installed. These expansion cards that are mounted on the riser card may be perpendicular to the riser card and thus parallel to a motherboard. In this example, PCB 100 is a riser card that includes cable surface mount pads 102, 105, 107, and 109 and a row of connector surface mount pads 144 that includes connector surface mount pads 133 and 140 among others. A set of cables may be physically coupled to cable surface mount pads 102, 105, 107, and 109. For example, the cable may be soldered via a cable hot-bar approach.

Traces, such as microstrips and striplines, provide a conductive path for the transmission of signals between cables coupled to the cable surface mount pads and a connector coupled to connector surface mount pads. The connector may be a Peripheral Component Interconnect-Express (PCIe) connector, an input/output card edge connector, a surface mount connector, or similar, and may be coupled to a row of connector surface mount pads. In this example, PCB 100 includes differential microstrip pairs 112, 116, 120, and 124 for coupling cable surface mount pads 102, 105, 107, and 109 to row of connector surface mount pads 144.

PCB 100 also includes cable surface mount pads 128, 135, 137, and 139 that may be coupled to a row of connector surface mount pads 174 that includes connector surface mount pads 162 and 172 via differential microstrip pairs 148, 152, 156, and 160. In this example, a set of cables may be physically coupled to cable surface mount pads 128, 135, 137, and 139 while a connector, such as a PCIe connector, an input/output card edge connector, a surface mount connector, or similar, may be coupled to row of connector surface mount pads 174. For example, PCB 100 may be plugged into a riser card connector or an edge card connector on the motherboard.

Differential microstrip pairs include two microstrips in parallel with space in between. Each microstrip in the pair may have the same width. As differential microstrip pairs 112, 116, 120, 124, 148, 152, 156, and 160 may be routed through on PCB 100 from the cable surface mount pads to the row of connector surface mount pads, width of spaces for the differential microstrip pairs may change. For example, some spaces at the surface mount pads and the connector surface mount pads may be relatively narrow which may require the differential microstrip pairs to "neck-down" at certain regions. The neck-down may include a change in the width of the differential microstrip pairs and a change in width of a space between the microstrips of the pair. This may be done to allow the differential microstrip pair to be routed. For example, the width of each microstrip trace may be reduced and the space between the microstrip traces narrowed to fit in the space between pads, components, vias, or other obstructions.

However, the neck-down regions of the differential microstrip pairs can introduce some issues, such as higher impedance in comparison to the impedance where the differential microstrip pairs that were not necked down. The higher impedance at the neck-down regions may affect noise and voltage margins of the signals. To control these issues, a coating of ultraviolet glue at the neck-down areas may be applied. For example, ultraviolet glue coatings 104, 106, 108, 110, 132, 134, 136, 138, 164, 166, 168, and 170 may be applied around the neck-down regions of differential microstrip pairs 112, 116, 120, 124, 148, 152, 156, and 160 respectively.

One of skill in the art will recognize that PCB 100 have been simplified for clarity of discussion and the circuit board may include more surface mount pads, differential microstrip pairs, and other components that have been illustrated while remaining within the scope of the present disclosure. Furthermore, a wide variety of other circuit boards and system features that have been omitted for clarity may be provided while remaining within the scope of the present disclosure. In addition, although the example shown herein uses surface mount technology connectors and surface mount pads, other connectors and pads used in the art may be used without limiting the present disclosure.

Figure 2:
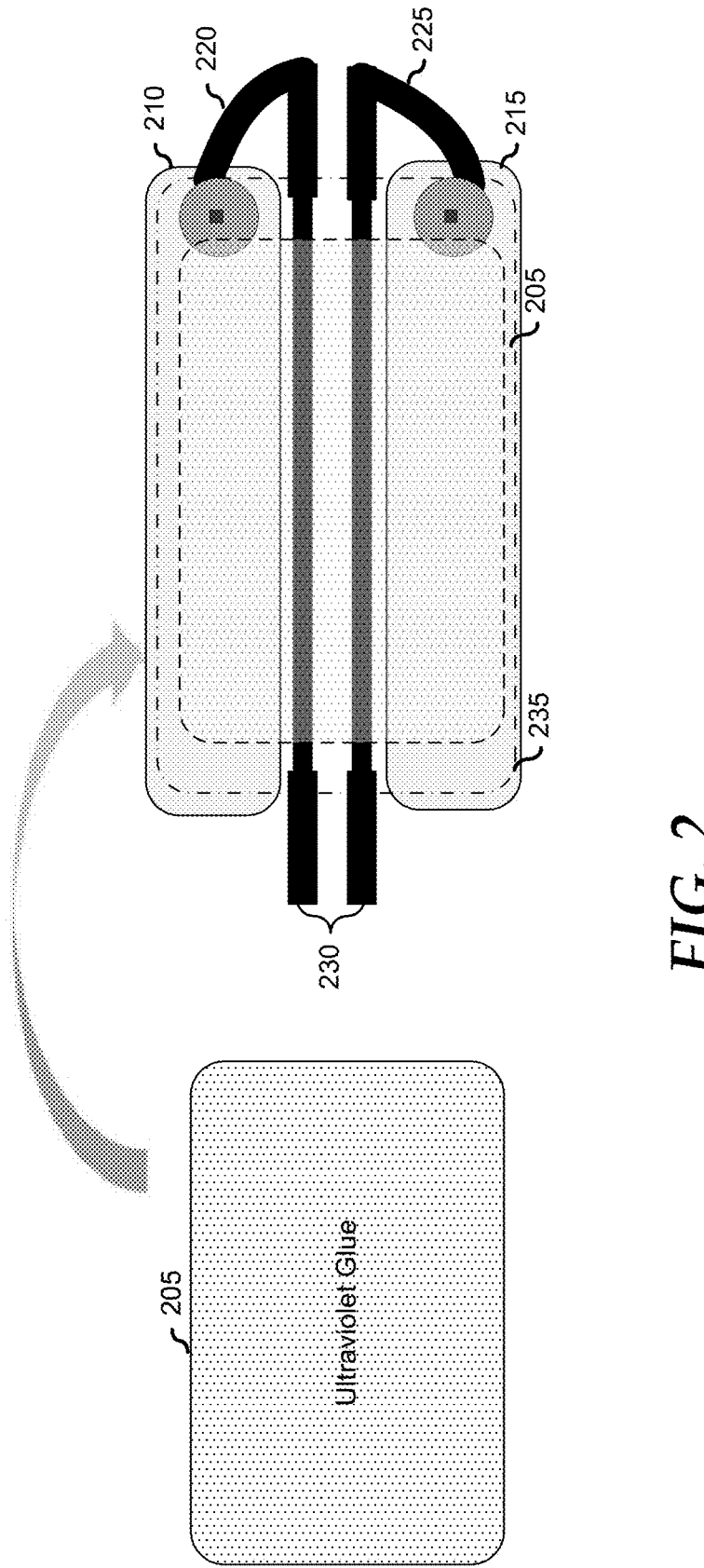
FIG. 2 is a diagram of an application of an ultraviolet glue coating to a neck-down area of a differential microstrip pair, according to an embodiment of the present disclosure.

FIG. 2 shows a diagram of an application of an ultraviolet glue coating to a neck-down area of a differential microstrip trace. The diagram includes a patch of ultraviolet glue 205, pads 210 and 215, and a differential microstrip pair 230 that includes microstrips 220 and 225. Pads 210 and 215 may be connection pads, surface mount pads, or similar. Patch of ultraviolet glue 205 may be applied or coated over a portion differential microstrip pair 230 and/or a portion of pads 210 and 215 to increase capacitance and reduce impedance around the neck-down area.

In this example, the length and width of the ultraviolet glue coating are less than the length and width of the neck-down area. Accordingly, the area of patch of ultraviolet glue 205 may be less than a neck-down area 235. For example, ultraviolet glue coating may cover a region that is about 80% to 90% of the neck-down area. However, a person of skill in the art will appreciate that the area of the ultraviolet glue coating may be equal to or greater than the neck-down area.

The ultraviolet glue may be applied on top of the solder mask and typically after various components and/or cables have been soldered in the PCB. The ultraviolet glue used may have a range of viscosity levels. For example, ultraviolet glue may be applied in a semi-liquid or gel form or similar viscosity. In particular, the viscosity of the ultraviolet glue may be in a range from 100 centipoises or greater. The ultraviolet glue can be cured by exposing it to ultraviolet or other visible light with sufficient intensity. In addition, the ultraviolet glue used may have a dielectric constant in the range of 2.0 to 4.0. Although patch of ultraviolet glue 205 does not include an additive, a person of skill in the art will appreciate that an additive such as a solder mask may be incorporated in the ultraviolet glue to alter one or more of its characteristics. In addition, while a specific differential microstrip has been illustrated and described, one of skill in the art will recognize that differential microstrip pairs may include a variety of different features, such as different turns, transitions, etc. while remaining within the scope of the present disclosure.

Figure 3:
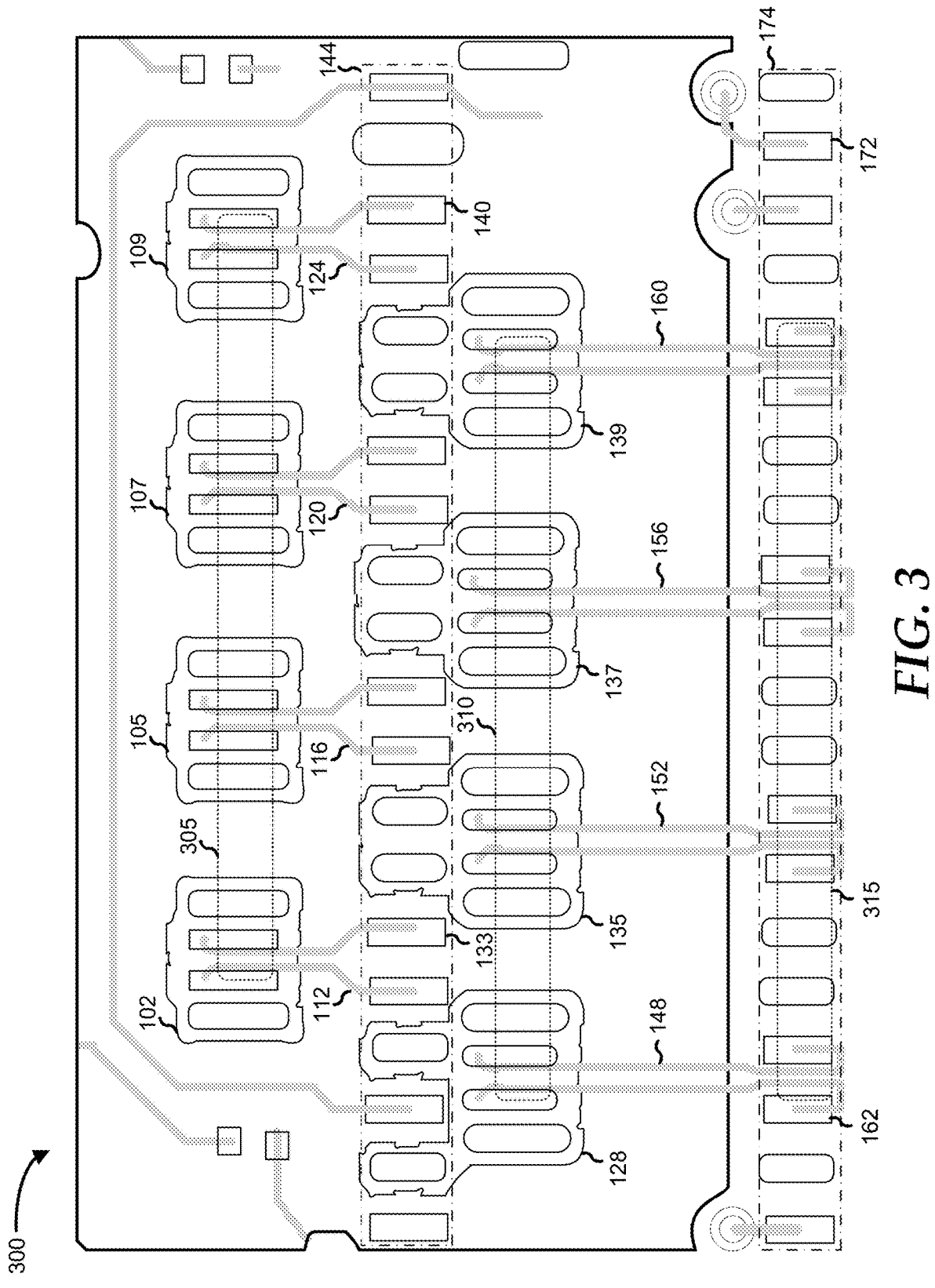
FIG. 3 is a diagram of a printed circuit board, according to an embodiment of the present disclosure.

FIG. 3 shows a PCB 300 which is similar to PCB 100 of FIG. 1. In this embodiment, ultraviolet glue coatings 305, 310, and 315 may be smeared across neck-down regions of differential microstrip pairs associated with cable surface mount pads instead of applying a patch of ultraviolet glue at each neck-down region.

FIG. 4 shows a table 400 that indicates results of an impedance sensitivity analysis of a neck-down area of a differential microstrip pair relative to an application of ultraviolet glue or lack thereof. Table 400 includes six rows that indicate the effect of ultraviolet glue or lack thereof to control impedance by increasing capacitance. Various thicknesses of the ultraviolet glue when applied to the neck-down area of the differential microstrip pair were tested. In this example, a thickness of one mil to three mils was tested. However, the thickness of the ultraviolet glue when applied may be from 0.5 to 4 mils. One of skill in the art will recognize that the differential microstrip pair may include an impedance that depends, at least in part, on the width of the microstrips in the differential microstrip pair as well as other factors, such as the dielectric constant of the microstrips, etc. Accordingly, for purposes of this analysis, ultraviolet glue may be applied to the same or substantially similar differential microstrip pair.

The first row of table 400 shows an impedance of 85 ohms for a differential microstrip pair with a width of 5.5 mils for each microstrip and a space of 6 mils between the microstrips without an application of ultraviolet glue. The second row shows an impedance of 93 ohms for a differential microstrip pair at a width of 3.5 mils at a neck-down region with a space of 4 mils between the microstrips without an application of the ultraviolet glue. As shown, there is an increase of 8 ohms at the neck-down region of the differential microstrip pair compared to a conventional region.

The third row shows an impedance of 85 ohms for the differential microstrip pair at a width of 3.5 mils at a neck-down region with a space of 4 mils between the microstrips with an application of the ultraviolet glue of 3 mils in thickness. As shown, there is a reduction of 8 ohms with the application of a three-mil thick ultraviolet glue in comparison to the impedance of the neck-down region without the ultraviolet glue. By reducing the thickness of the ultraviolet glue to 2 mils and applying it to the same neck-down region the impedance increased to 86 ohms and to 86.5 ohms when the thickness of the ultraviolet glue is reduced to 1.5 mils. Following the trend, the impedance increases to 87 ohms when the thickness of the ultraviolet glue applied is 1 mil which is still better than the 93 ohms without the ultraviolet glue. Therefore, given a range of thickness from 3 mils to 1 mil application of the ultraviolet glue to the neck-down area of a differential microstrip pair may increase its capacitance which reduces the impedance.

To perform the sensitivity analysis provided herein, a PCB similar to PCB 100 or PCB 300 may be provided in a variety of board manufacturing and/or trace routing systems known in the art. In particular, a differential microstrip pair having a first width for each microstrip and a first space width between the microstrips of the pair may be provided. A second width for each microstrip and a second space width between the microstrips at neck-down regions may also be provided. The second width and the second space width may be thinner and narrower than the first width and the first space width respectively. In addition, ultraviolet glue may be applied at the neck-down regions, wherein the ultraviolet glue may be coated over a solder mask layer at a specified thickness as described above. The thickness of the ultraviolet glue may be determined during the design phase of the manufacture. The impedance at the neck-down and other regions of the differential microstrip pair may also be determined.

The components shown are not drawn to scale and PCB 100 and PCB 300 may include additional or fewer components. In addition, connections between components may be omitted for descriptive clarity. In addition, it should be noted that although embodiments herein may be described within the context of a riser card, aspects of the present disclosure are not so limited. A person of skill in the art will appreciate that the teachings described herein are applicable to other PCBs, such as a motherboard, a graphics processing unit, or a network interface card, etc. may benefit from using the teachings described herein. Accordingly, the aspects of the present disclosure may be applied or adapted for use in many other contexts.

Those of ordinary skill in the art will appreciate that the configuration, hardware, and/or software components of PCB 100 and PCB 300 are depicted in FIG. 2 and FIG. 3 respectively may vary. For example, the illustrative components within PCB 100 and PCB 300 are not intended to be exhaustive but rather are representative to highlight components that can be utilized to implement aspects of the present disclosure. For example, other devices and/or components may be used in addition to or in place of the devices/components depicted. The depicted example does not convey or imply any architectural or other limitations with respect to the presently described embodiments and/or the general disclosure. In the discussion of the figures, reference may also be made to components illustrated in other figures for continuity of the description.

FIG. 5 illustrates an embodiment of an information handling system 500 including processors 502 and 504, a chipset 510, a memory 520, a graphics adapter 530 connected to a video display 534, a non-volatile RAM (NV-RAM) 540 that includes a basic input and output system/extensible firmware interface (BIOS/EFI) module 542, a disk controller 550, a hard disk drive (HDD) 554, an optical disk drive 556, a disk emulator 560 connected to a solid-state drive (SSD) 564, an input/output (I/O) interface 570 connected to an add-on resource 574 and a trusted platform module (TPM) 576, a network interface 580, and a baseboard management controller (BMC) 590. Processor 502 is connected to chipset 510 via processor interface 506, and processor 504 is connected to the chipset via processor interface 508. In a particular embodiment, processors 502 and 504 are connected together via a high-capacity coherent fabric, such as a HyperTransport link, a QuickPath Interconnect, or the like. Chipset 510 represents an integrated circuit or group of integrated circuits that manage the data flow between processors 502 and 504 and the other elements of information handling system 500. In a particular embodiment, chipset 510 represents a pair of integrated circuits, such as a northbridge component and a southbridge component. In another embodiment, some or all of the functions and features of chipset 510 are integrated with one or more of processors 502 and 504.

Memory 520 is connected to chipset 510 via a memory interface 522. An example of memory interface 522 includes a Double Data Rate (DDR) memory channel and memory 520 represents one or more DDR Dual In-Line Memory Modules (DIMMs). In a particular embodiment, memory interface 522 represents two or more DDR channels. In another embodiment, one or more of processors 502 and 504 include a memory interface that provides a dedicated memory for the processors. A DDR channel and the connected DDR DIMMs can be in accordance with a particular DDR standard, such as a DDR3 standard, a DDR4 standard, a DDR5 standard, or the like.

Memory 520 may further represent various combinations of memory types, such as Dynamic Random Access Memory (DRAM) DIMMs, Static Random Access Memory (SRAM) DIMMs, non-volatile DIMMs (NV-DIMMs), storage class memory devices, Read-Only Memory (ROM) devices, or the like. Graphics adapter 530 is connected to chipset 510 via a graphics interface 532 and provides a video display output 536 to a video display 534. An example of a graphics interface 532 includes a PCIe interface and graphics adapter 530 can include a four-lane (×4) PCIe adapter, an eight-lane (×8) PCIe adapter, a 16-lane (×16) PCIe adapter, or another configuration, as needed, or desired. In a particular embodiment, graphics adapter 530 is provided down on a system printed circuit board (PCB). Video display output 536 can include a Digital Video Interface (DVI), a High-Definition Multimedia Interface (HDMI), a DisplayPort interface, or the like, and video display 534 can include a monitor, a smart television, an embedded display such as a laptop computer display, or the like.

NV-RAM 540, disk controller 550, and I/O interface 570 are connected to chipset 510 via an I/O channel 512. An example of I/O channel 512 includes one or more point-to-point PCIe links between chipset 510 and each of NV-RAM 540, disk controller 550, and I/O interface 570. Chipset 510 can also include one or more other I/O interfaces, including a PCIe interface, an Industry Standard Architecture (ISA) interface, a Small Computer Serial Interface (SCSI) interface, an Inter-Integrated Circuit (I²C) interface, a System Packet Interface (SPI), a Universal Serial Bus (USB), another interface, or a combination thereof. NV-RAM 540 includes BIOS/EFI module 542 that stores machine-executable code (BIOS/EFI code) that operates to detect the resources of information handling system 500, to provide drivers for the resources, to initialize the resources, and to provide common access mechanisms for the resources. The functions and features of BIOS/EFI module 542 will be further described below.

Disk controller 550 includes a disk interface 552 that connects the disc controller to a hard disk drive (HDD) 554, to an optical disk drive (ODD) 556, and to disk emulator 560. An example of disk interface 552 includes an Integrated Drive Electronics (IDE) interface, an Advanced Technology Attachment (ATA) such as a parallel ATA (PATA) interface or a serial ATA (SATA) interface, a SCSI interface, a USB interface, a proprietary interface, or a combination thereof. Disk emulator 560 permits SSD 564 to be connected to information handling system 500 via an external interface 562. An example of external interface 562 includes a USB interface, an institute of electrical and electronics engineers (IEEE) 1394 (Firewire) interface, a proprietary interface, or a combination thereof. Alternatively, SSD 564 can be disposed within information handling system 500.

I/O interface 570 includes a peripheral interface 572 that connects the I/O interface to add-on resource 574, to TPM 576, and to network interface 580. Peripheral interface 572 can be the same type of interface as I/O channel 512 or can be a different type of interface. As such, I/O interface 570 extends the capacity of I/O channel 512 when peripheral interface 572 and the I/O channel are of the same type, and the I/O interface translates information from a format suitable to the I/O channel to a format suitable to the peripheral interface 572 when they are of a different type. Add-on resource 574 can include a data storage system, an additional graphics interface, a network interface card (NIC), a sound/video processing card, another add-on resource, or a combination thereof. Add-on resource 574 can be on a main circuit board, on separate circuit board, or add-in card disposed within information handling system 500, a device that is external to the information handling system, or a combination thereof.

Network interface 580 represents a network communication device disposed within information handling system 500, on a main circuit board of the information handling system, integrated onto another component such as chipset 510, in another suitable location, or a combination thereof. Network interface 580 includes a network channel 582 that provides an interface to devices that are external to information handling system 500. In a particular embodiment, network channel 582 is of a different type than peripheral interface 572, and network interface 580 translates information from a format suitable to the peripheral channel to a format suitable to external devices.

In a particular embodiment, network interface 580 includes a NIC or host bus adapter (HBA), and an example of network channel 582 includes an InfiniBand channel, a Fibre Channel, a Gigabit Ethernet channel, a proprietary channel architecture, or a combination thereof. In another embodiment, network interface 580 includes a wireless communication interface, and network channel 582 includes a Wi-Fi channel, a near-field communication (NFC) channel, a Bluetooth® or Bluetooth-Low-Energy (BLE) channel, a cellular based interface such as a Global System for Mobile (GSM) interface, a Code-Division Multiple Access (CDMA) interface, a Universal Mobile Telecommunications System (UMTS) interface, a Long-Term Evolution (LTE) interface, or another cellular based interface, or a combination thereof. Network channel 582 can be connected to an external network resource (not illustrated). The network resource can include another information handling system, a data storage system, another network, a grid management system, another suitable resource, or a combination thereof.

BMC 590 is connected to multiple elements of information handling system 500 via one or more management interface 592 to provide out of band monitoring, maintenance, and control of the elements of the information handling system. As such, BMC 590 represents a processing device different from processor 502 and processor 504, which provides various management functions for information handling system 500. For example, BMC 590 may be responsible for power management, cooling management, and the like. The term BMC is often used in the context of server systems, while in a consumer-level device, a BMC may be referred to as an embedded controller (EC). A BMC included in a data storage system can be referred to as a storage enclosure processor. A BMC included at a chassis of a blade server can be referred to as a chassis management controller and embedded controllers included at the blades of the blade server can be referred to as blade management controllers. Capabilities and functions provided by BMC 590 can vary considerably based on the type of information handling system. BMC 590 can operate in accordance with an Intelligent Platform Management Interface (IPMI). Examples of BMC 590 include an Integrated Dell® Remote Access Controller (iDRAC).

Management interface 592 represents one or more out-of-band communication interfaces between BMC 590 and the elements of information handling system 500, and can include a I²C bus, a System Management Bus (SMBus), a Power Management Bus (PMBUS), a Low Pin Count (LPC) interface, a serial bus such as a Universal Serial Bus (USB) or a Serial Peripheral Interface (SPI), a network interface such as an Ethernet interface, a high-speed serial data link such as a PCIe interface, a Network Controller Sideband Interface (NC-SI), or the like. As used herein, out-of-band access refers to operations performed apart from a BIOS/operating system execution environment on information handling system 500, that is apart from the execution of code by processors 502 and 504 and procedures that are implemented on the information handling system in response to the executed code.

BMC 590 operates to monitor and maintain system firmware, such as code stored in BIOS/EFI module 542, option ROMs for graphics adapter 530, disk controller 550, add-on resource 574, network interface 580, or other elements of information handling system 500, as needed or desired. In particular, BMC 590 includes a network interface 594 that can be connected to a remote management system to receive firmware updates, as needed or desired. Here, BMC 590 receives the firmware updates, stores the updates to a data storage device associated with the BMC, transfers the firmware updates to NV-RAM of the device or system that is the subject of the firmware update, thereby replacing the currently operating firmware associated with the device or system, and reboots information handling system, whereupon the device or system utilizes the updated firmware image.

BMC 590 utilizes various protocols and application programming interfaces (APIs) to direct and control the processes for monitoring and maintaining the system firmware. An example of a protocol or API for monitoring and maintaining the system firmware includes a graphical user interface (GUI) associated with BMC 590, an interface defined by the Distributed Management Taskforce (DMTF) (such as a Web Services Management (WSMan) interface, a Management Component Transport Protocol (MCTP) or, a Redfish® interface), various vendor defined interfaces (such as a Dell EMC Remote Access Controller Administrator (RACADM) utility, a Dell EMC OpenManage Enterprise, a Dell EMC OpenManage Server Administrator (OMSS) utility, a Dell EMC OpenManage Storage Services (OMSS) utility, or a Dell EMC OpenManage Deployment Toolkit (DTK) suite), a BIOS setup utility such as invoked by a "F2" boot option, or another protocol or API, as needed or desired.

In a particular embodiment, BMC 590 is included on a main circuit board (such as a baseboard, a motherboard, or any combination thereof) of information handling system 500 or is integrated onto another element of the information handling system such as chipset 510, or another suitable element, as needed or desired. As such, BMC 590 can be part of an integrated circuit or a chipset within information handling system 500. An example of BMC 590 includes an iDRAC, or the like. BMC 590 may operate on a separate power plane from other resources in information handling system 500. Thus BMC 590 can communicate with the management system via network interface 594 while the resources of information handling system 500 are powered off. Here, information can be sent from the management system to BMC 590 and the information can be stored in a RAM or NV-RAM associated with the BMC. Information stored in the RAM may be lost after power-down of the power plane for BMC 590, while information stored in the NV-RAM may be saved through a power-down/power-up cycle of the power plane for the BMC.

Information handling system 500 can include additional components and additional buses, not shown for clarity. For example, information handling system 500 can include multiple processor cores, audio devices, and the like. While a particular arrangement of bus technologies and interconnections is illustrated for the purpose of example, one of skill will appreciate that the techniques disclosed herein are applicable to other system architectures. Information handling system 500 can include multiple central processing units (CPUs) and redundant bus controllers. One or more components can be integrated together. Information handling system 500 can include additional buses and bus protocols, for example, I²C and the like. Additional components of information handling system 500 can include one or more storage devices that can store machine-executable code, one or more communications ports for communicating with external devices, and various input and output (I/O) devices, such as a keyboard, a mouse, and a video display.

When referred to as a "device," a "module," a "unit," a "controller," or the like, the embodiments described herein can be configured as hardware. For example, a portion of an information handling system device may be hardware such as, for example, an integrated circuit (such as an Application Specific Integrated Circuit (ASIC), a Field Programmable Gate Array (FPGA), a structured ASIC, or a device embedded on a larger chip), a card (such as a Peripheral Component Interface (PCI) card, a PCI-express card, a Personal Computer Memory Card International Association (PCM-CIA) card, or other such expansion card), or a system (such as a motherboard, a system-on-a-chip (SoC), or a stand-alone device).

The present disclosure contemplates a computer-readable medium that includes instructions or receives and executes instructions responsive to a propagated signal; so that a device connected to a network can communicate voice, video, or data over the network. Further, the instructions may be transmitted or received over the network via the network interface device.

While the computer-readable medium is shown to be a single medium, the term "computer-readable medium" includes a single medium or multiple media, such as a centralized or distributed database, and/or associated caches and servers that store one or more sets of instructions. The term "computer-readable medium" shall also include any medium that is capable of storing, encoding, or carrying a set of instructions for execution by a processor or that cause a computer system to perform any one or more of the methods or operations disclosed herein.

In a particular non-limiting, exemplary embodiment, the computer-readable medium can include a solid-state memory such as a memory card or other package that houses one or more non-volatile read-only memories. Further, the computer-readable medium can be a random-access memory or other volatile re-writable memory. Additionally, the computer-readable medium can include a magneto-optical or optical medium, such as a disk or tapes, or another storage device to store information received via carrier wave signals such as a signal communicated over a transmission medium. A digital file attachment to an e-mail or other self-contained information archive or set of archives may be considered a distribution medium that is equivalent to a tangible storage medium. Accordingly, the disclosure is considered to include any one or more of a computer-readable medium or a distribution medium and other equivalents and successor media, in which data or instructions may be stored.

Although only a few exemplary embodiments have been described in detail above, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents but also equivalent structures.

What is claimed is:

1. A printed circuit board comprising:
   a differential microstrip pair including a neck-down area; and
   an ultraviolet glue coating a portion of the neck-down area of the differential microstrip pair to control an impedance of the differential microstrip pair, wherein the ultraviolet glue coating is applied over a solder mask layer.

2. The printed circuit board of claim 1, wherein the neck-down area includes a change in width of the differential microstrip pair.

3. The printed circuit board of claim 1, wherein the ultraviolet glue coating has a viscosity of at least one hundred centipoises.

4. The printed circuit board of claim 1, wherein an area of the ultraviolet glue coating is less than the neck-down area of the differential microstrip pair.

5. The printed circuit board of claim 1, wherein a thickness of the ultraviolet glue coating is at least 0.5 mil.

6. The printed circuit board of claim 1, wherein a dielectric constant of the ultraviolet glue coating is at least two.

7. The printed circuit board of claim 1, wherein a thickness of the ultraviolet glue coating is up to four mils.

8. An information handling system, comprising:
   a processor; and
   a printed circuit board further comprising:
      a differential microstrip pair including a neck-down area; and
      an ultraviolet glue coating a portion of the neck-down area of the differential microstrip pair to control impedance of the differential microstrip pair, wherein an area of the ultraviolet glue coating is less than the neck-down area of the differential microstrip pair.

9. The information handling system of claim 8, wherein the ultraviolet glue coating is applied over a solder mask layer.

10. The information handling system of claim 8, wherein the ultraviolet glue coating has a viscosity of at least one hundred centipoises.

11. The information handling system of claim 8, wherein the neck-down area includes a change in width of the differential microstrip pair.

12. The information handling system of claim 8, wherein a thickness of the ultraviolet glue coating is at least 0.5 mil.

13. The information handling system of claim 8, wherein a dielectric constant of the ultraviolet glue coating is at least two.

14. The information handling system of claim 8, wherein a thickness of the ultraviolet glue coating is up to four mils.

15. A method comprising:
   providing a differential microstrip pair including a neck-down area; and
   providing an ultraviolet glue coating a portion of the neck-down area of the differential microstrip pair to control impedance of the differential microstrip pair, wherein the ultraviolet glue coating is applied over a solder mask layer.

16. The method of claim 15, wherein the neck-down area includes a change in width of the differential microstrip pair.

17. The method of claim 15, wherein the ultraviolet glue coating has a viscosity of at least one hundred centipoises.

18. The method of claim 15, wherein an area of the ultraviolet glue coating is greater than the neck-down area of the differential microstrip pair.

19. The method of claim 15, wherein a thickness of the ultraviolet glue coating is at least 0.5 mil.

20. The method of claim 15, wherein a dielectric constant of the ultraviolet glue coating is at least two.

\* \* \* \* \*